United States Patent
Han et al.

(10) Patent No.: US 9,859,163 B2
(45) Date of Patent: Jan. 2, 2018

(54) METHODS FOR MANUFACTURING A SEMICONDUCTOR DEVICE

(71) Applicant: Samsung Electronics Co., Ltd., Suwon-si (KR)

(72) Inventors: Kyounghoon Han, Seoul (KR); Junho Yoon, Suwon-si (KR); Kisoo Chang, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/235,175

(22) Filed: Aug. 12, 2016

(65) Prior Publication Data

US 2017/0047257 A1    Feb. 16, 2017

(30) Foreign Application Priority Data

Aug. 12, 2015 (KR) .................. 10-2015-0113956

(51) Int. Cl.
| | |
|---|---|
| *H01L 21/8234* | (2006.01) |
| *H01L 27/088* | (2006.01) |
| *H01L 29/66* | (2006.01) |
| *H01L 21/311* | (2006.01) |
| *H01L 29/78* | (2006.01) |

(52) U.S. Cl.
CPC .......... *H01L 21/823431* (2013.01); *H01L 21/31144* (2013.01); *H01L 21/823418* (2013.01); *H01L 21/823468* (2013.01); *H01L 21/823475* (2013.01); *H01L 27/0886* (2013.01); *H01L 29/66545* (2013.01); *H01L 29/66795* (2013.01); *H01L 29/785* (2013.01)

(58) Field of Classification Search
CPC ....... H01L 21/823431; H01L 29/66795; H01L 21/823418; H01L 29/785; H01L 21/31144; H01L 21/823468; H01L 29/66545; H01L 27/0886; H01L 21/823475; H01L 29/6671

See application file for complete search history.

(56) References Cited

U.S. PATENT DOCUMENTS

| | | | |
|---|---|---|---|
| 7,332,775 B2 | 2/2008 | Steiner et al. | |
| 7,397,131 B2 | 7/2008 | Kim et al. | |
| 8,053,358 B2* | 11/2011 | Lee .................. | H01L 21/76831 257/E21.577 |

(Continued)

FOREIGN PATENT DOCUMENTS

| | | |
|---|---|---|
| KR | 10-2005-0023982 A | 3/2005 |
| KR | 10-2009-0022680 A | 3/2005 |

(Continued)

*Primary Examiner* — Selim Ahmed
(74) *Attorney, Agent, or Firm* — Muir Patent Law, PLLC

(57) ABSTRACT

A method for manufacturing a semiconductor device includes forming gate structures spaced apart from each other on a substrate, gate spacers covering sidewalls of the gate structures, and an interlayer insulating layer covering the gate spacers, forming a contact hole that penetrates the interlayer insulating layer to expose a sidewall of at least one of the gate spacers, forming a sacrificial gap-fill pattern filling a lower portion of the contact hole, forming a contact spacer on a sidewall of the contact hole having the sacrificial gap-fill pattern, and forming a contact filling the contact hole after removing the sacrificial gap-fill pattern.

20 Claims, 10 Drawing Sheets

(56) References Cited

U.S. PATENT DOCUMENTS 8,927,408 B2    1/2015   Li et al.
9,059,257 B2    6/2015   Li et al.
9,728,601 B2 *   8/2017   Kim .................... H01L 27/0924

FOREIGN PATENT DOCUMENTS

| KR | 10-2005-0038469 A | 4/2005 |
| KR | 10-2005-0066369 A | 6/2005 |

\* cited by examiner

METHODS FOR MANUFACTURING A SEMICONDUCTOR DEVICE

CROSS-REFERENCE TO RELATED APPLICATION

This U.S. non-provisional patent application claims priority under 35 U.S.C. §119 to Korean Patent Application No. 10-2015-0113956, filed on Aug. 12, 2015, in the Korean Intellectual Property Office, the disclosure of which is hereby incorporated by reference in its entirety.

BACKGROUND

The present disclosure relates to methods for manufacturing a semiconductor device and, more particularly, to a method for manufacturing a semiconductor device capable of preventing a short between a gate electrode and a contact.

A semiconductor device may include an integrated circuit including metal-oxide-semiconductor field effect transistors (MOSFETs). As sizes and design rules of semiconductor devices have been reduced, MOSFETs have been scaled down. The scale down of MOSFETs may cause a short channel effect, so operating characteristics of semiconductor devices may be deteriorated. Thus, various research has been conducted for semiconductor devices capable of improving performance and of addressing various shortcomings caused by high integration degrees of semiconductor devices.

SUMMARY

Example embodiments may provide method for manufacturing a semiconductor device capable of preventing an electrical short between a gate electrode and a contact provided with the gate electrode.

Example embodiments may also provide method for manufacturing a semiconductor device capable of improving reliability.

In one aspect, a method for manufacturing a semiconductor device may include forming a plurality of gate structures spaced apart from each other on a substrate in a first direction, a plurality of gate spacers covering sidewalls of the plurality of gate structures, and an interlayer insulating layer covering the plurality of gate spacers, forming a contact hole that penetrates the interlayer insulating layer to expose a sidewall of at least one of the plurality of gate spacers, forming a sacrificial gap-fill pattern filling a lower portion of the contact hole, forming a contact spacer on a sidewall of the contact hole having the sacrificial gap-fill pattern, and forming a contact filling the contact hole after removing the sacrificial gap-fill pattern.

In an embodiment, the forming of the contact hole may include forming a mask pattern on the interlayer insulating layer, and patterning the interlayer insulating layer using the mask pattern.

In an embodiment, the mask pattern may be a carbon-based spin-on-hardmask (SOH) pattern, a silicon-based SOH pattern, an amorphous carbon pattern, or a photoresist pattern.

In an embodiment, the mask pattern may include the same material as the sacrificial gap-fill pattern.

In an embodiment, at least a portion of the gate spacer may be removed when the contact hole is formed. The contact spacer may be substituted for the removed portion of the gate spacer.

In an embodiment, a bottom surface of the contact spacer may be disposed at the same level as a bottom surface of the recess region.

In an embodiment, a bottom surface of the contact spacer may be disposed at the same level as a top surface of the sacrificial gap-fill pattern.

In an embodiment, the sacrificial gap-fill pattern may be a carbon-based spin-on-hardmask (SOH) pattern, a silicon-based SOH pattern, or an amorphous carbon pattern.

In an embodiment, the forming of the sacrificial gap-fill pattern may include forming a sacrificial gap-fill layer filling the contact hole on the substrate, and performing an etch-back process on the sacrificial gap-fill layer.

In an embodiment, the sacrificial gap-fill layer may include a carbon-based spin-on-hardmask (SOH) layer, and the etch-back process may include an oxygen plasma etching process.

In an embodiment, the contact spacer may include the same insulating material as the gate spacer.

In an embodiment, the contact spacer and the gate spacer may include insulating materials different from each other.

In an embodiment, the contact spacer may include at least one of silicon oxynitride, silicon oxide, silicon-carbon nitride, silicon-boron nitride, silicon-carbon oxynitride, or silicon nitride.

In an embodiment, the contact may include a first portion being in contact with the contact spacer; and a second portion being in contact with the gate spacer. A width of the first portion of the contact may be equal to or greater than a width of the second portion of the contact.

In another aspect, a source/drain region may be formed between two gate structures of the plurality of gate structures on the substrate, the interlayer insulating layer covering the plurality of gate spacers and the source/drain region; and a contact hole may be formed that penetrates the interlayer insulating layer to expose a top surface of the source/drain region and sidewalls of the plurality of gate spacers.

In still another aspect, a semiconductor device may include a substrate, a gate structure on the substrate, a gate spacer disposed on a sidewall of the gate structure and having a recess region formed in an upper sidewall of the gate spacer, a contact spacer filling the recess region, and a contact being in contact with a sidewall of the gate spacer and a sidewall of the contact spacer. A distance from the gate structure to the sidewall, being in contact with the contact spacer, of the gate spacer may be smaller than a distance from the gate structure to the sidewall, being in contact with the contact, of the gate spacer.

In still another aspect, a method may include providing a substrate, providing a gate structure on the substrate, providing a gate spacer disposed on a sidewall of the gate structure and having a recess region formed in an upper sidewall of the gate spacer, providing a contact spacer filling the recess region and contacting a sidewall of the gate spacer of the recess region, and providing an electrical contact being in contact with the sidewall of the gate spacer and a sidewall of the contact spacer. In some embodiments, an outer sidewall of the gate spacer at the recess region may, for example, contact a first sidewall of the contact spacer at the recess region. In some embodiments, a top surface of the of the gate spacer at the recess region may, for example, contact a bottom surface of the contact spacer at the recess region.

BRIEF DESCRIPTION OF THE DRAWINGS

The exemplary embodiments will become more apparent in view of the attached drawings and accompanying detailed description.

DETAILED DESCRIPTION OF THE EMBODIMENTS

Figure 1:
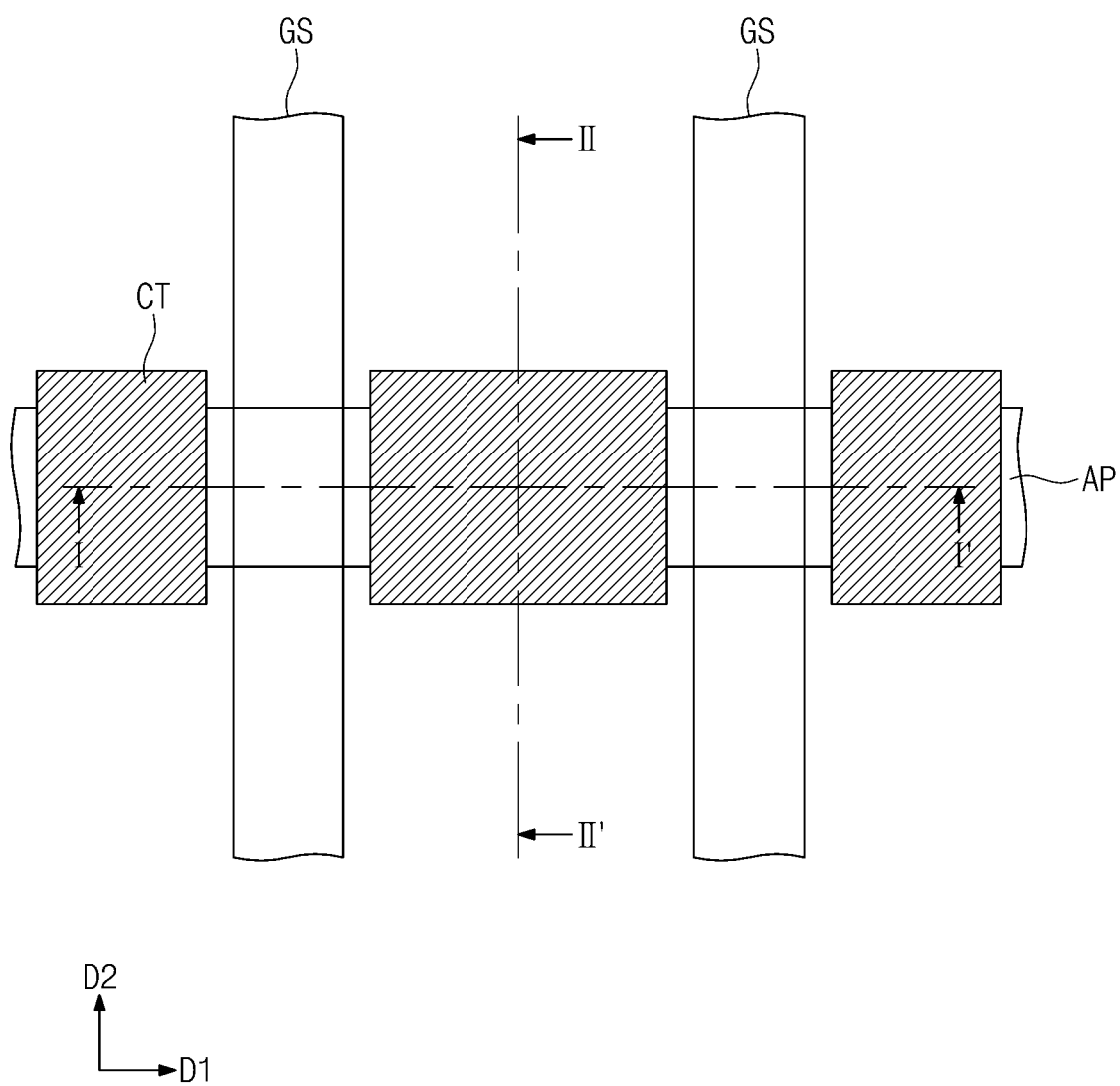
FIG. 1 is a plan view illustrating a semiconductor device according to exemplary embodiments of the inventive concepts.

The exemplary embodiments will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and may be exaggerated for clarity. As will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Moreover, exemplary embodiments are described herein with reference to cross-sectional views and/or plan views that are idealized exemplary views. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

It will be also understood that although the terms first, second, third etc. may be used herein to describe various elements, these elements should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising," "having," "containing," "includes" and/or "including", when used herein, are to be construed as open-ended terms and specify the presence of stated features, integers, steps, operations, elements, and/or components, but do not preclude the presence or addition of one or more other features, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, exemplary embodiments of the inventive concepts will be described in detail with reference to the accompanying drawings.

Figure 2:
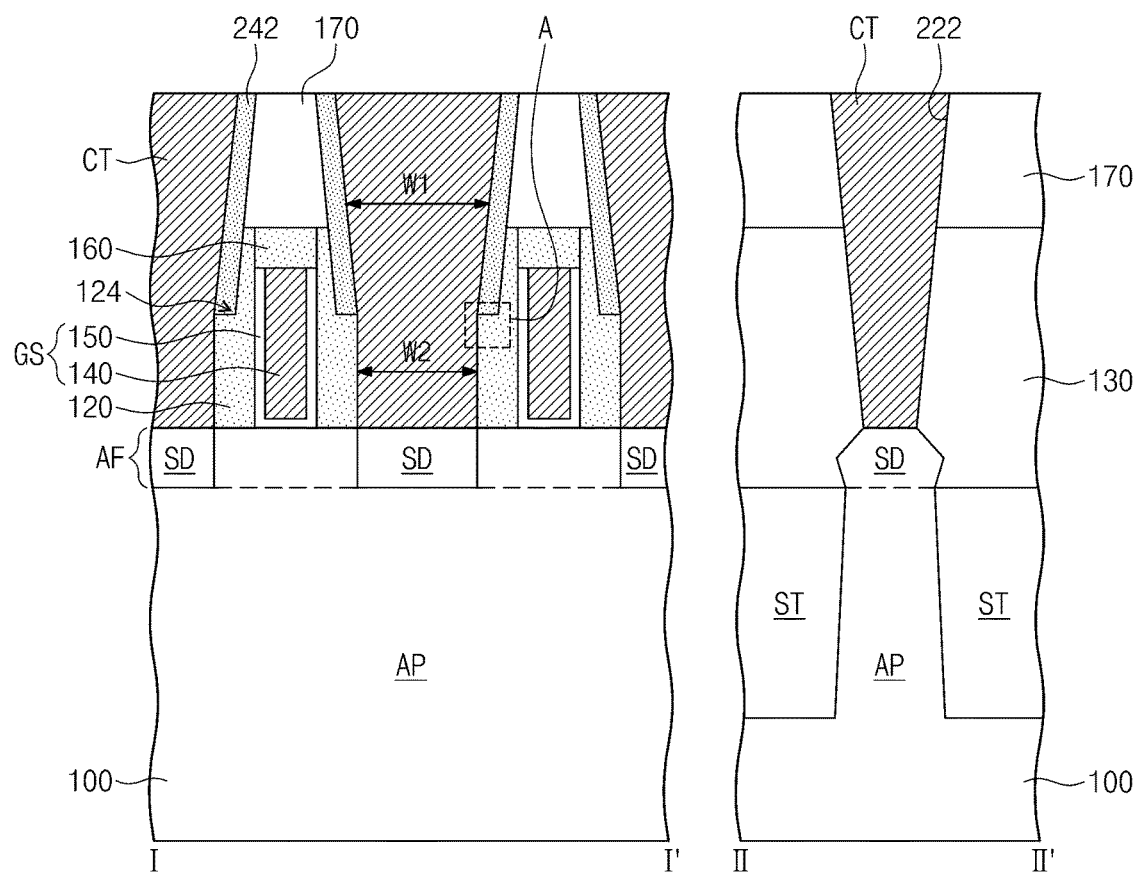
FIG. 2 is a cross-sectional view taken along lines I-I' and II-II' of FIG. 1 to illustrate a semiconductor device according to exemplary embodiments of the inventive concepts.
Figure 3:
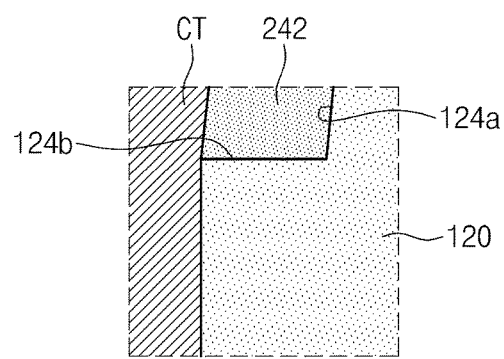
FIG. 3 is an enlarged view of a portion 'A' of FIG. 2 to illustrate a lower portion of a contact spacer.

FIG. 1 is a plan view illustrating a semiconductor device according to exemplary embodiments of the inventive concepts. FIG. 2 is a cross-sectional view taken along lines I-I' and II-II' of FIG. 1 to illustrate a semiconductor device according to exemplary embodiments of the inventive concepts. FIG. 3 is an enlarged view of a portion 'A' of FIG. 2 to illustrate a lower portion of a contact spacer.

As used herein, a semiconductor device may refer to any of the various devices such as shown in FIGS. 1-11, and may also refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIGS. 1 to 3, a substrate 100 may be provided. The substrate 100 may be, for example, a silicon substrate, a germanium substrate, or a silicon-on-insulator (SOI) substrate. Device isolation layers ST may be formed in the substrate 100 to define an active pattern AP. The active pattern AP may be provided between the device isolation layers ST. The device isolation layers ST may include, for example, at least one of an oxide (e.g., silicon oxide), a nitride (e.g., silicon nitride), or an oxynitride (e.g., silicon oxynitride). A width of the device isolation layer ST may become progressively less from a top end toward a bottom end of the device isolation layer ST. Thus, a width of the active pattern AP may become progressively greater from a top end toward a bottom end of the active pattern AP.

The active pattern AP may extend in a first direction D1. The active pattern AP may be provided in plurality, the plurality of active patterns AP may be spaced apart from each other in a second direction D2. In an embodiment, the active pattern AP may include an active fin AF vertically extending from a top surface of the active pattern AP. In an embodiment, a top surface of the active fin AF may be disposed at a higher level than top surfaces of the device isolation layers ST. For example, the active fin AF may have sidewalls vertical to a surface of the substrate 100 and the top surface parallel to the surface of the substrate 100. In an embodiment, the top surface of the active pattern AP may be disposed at the same level as the top surfaces of the device isolation layers ST. The active pattern AP may include source/drain regions SD.

Gate structures GS may be provided on the substrate 100 to cross over the active pattern AP and the device isolation layers ST. Each of the gate structures GS may include a gate dielectric layer 150 and a gate electrode 140. The gate structures GS may extend in the second direction D2. For example, the gate structures GS may intersect the active pattern AP and the device isolation layers ST when viewed from a plan view. The gate structures GS may be spaced apart from each other in the first direction D1.

Gate spacers 120 may be disposed on both sidewalls of each of the gate structures GS. The gate spacers 120 may extend in the second direction D2. The gate spacers 120 may be spaced apart from each other in the first direction D1. A capping pattern 160 may be disposed on the gate electrode 140 and the gate dielectric layer 150 of each of the gate structures GS. The gate spacers 120 may extend upward to cover both sidewalls of the capping pattern 160. The gate spacer 120 may include an insulating material. For example, the gate spacer 120 may have a single-layered structure or multi-layered structure including at least one of silicon oxynitride, silicon oxide, silicon-carbon nitride, silicon-boron nitride, silicon-carbon oxynitride, or silicon nitride. The gate spacer 120 may prevent an electrical short between the gate electrode 140 and a contact CT to be described later. In an embodiment, the capping pattern 160 may include the same insulating material as the gate spacer 120.

The gate spacer 120 may have a recess region 124. The gate spacer 120 may have an inner sidewall adjacent to the gate electrode 140 and an outer sidewall opposite to the inner sidewall. The outer sidewall of an upper portion of the gate spacer 120 may be recessed to form the recess region 124. In an embodiment, the upper portion of the gate spacer 120 and the capping pattern 160 may be recessed together to form the recess region 124. A sidewall 124a of the recess region 124 may be inclined. The sidewall 124a of the recess region 124 (or a sidewall of the gate spacer 120 being in contact with a contact spacer 242 to be described later) may be closer to the gate electrode 140 than a sidewall of the gate spacer 120 not being in contact with the recess region 124. For example, a distance between the gate electrode 140 and the sidewall 124a of the gate spacer 120 at recess region 124 (e.g., at an upper portion of the gate spacer 120) may be smaller than a distance between the gate electrode 140 and the sidewall of the gate spacer 120 not at the recess region 124 (e.g., at a lower portion of the gate spacer 120). If the contact CT fills the recess region 124, an electrical short may occur between the contact CT and the gate electrode 140.

Referring to FIGS. 2 and 3, the contact spacer 242 may be provided between the gate electrode 140 and the contact CT to fill the recess region 124. In an exemplary embodiment, the contact spacer 242 may include the same insulating material as the gate spacer 120. For example, the contact spacer 242 may include at least one of silicon oxynitride, silicon oxide, silicon-carbon nitride, silicon-boron nitride, silicon-carbon oxynitride, or silicon nitride. An electrical short between the contact CT and the gate electrode 140 may be prevented by the contact spacer 242. In an embodiment, the contact spacer 242 may include a different insulating material from the gate spacer 120.

Referring again to FIGS. 1 and 2, interlayer insulating layers 130 and 170 may be provided on the substrate 100. The interlayer insulating layers 130 and 170 may include an insulating material having an etch selectivity with respect to the gate spacer 120. For example, the interlayer insulating layers 130 and 170 may include silicon oxide.

The contact CT may be provided between the gate structures GS. The contact CT may penetrate the interlayer insulating layers 130 and 170 so as to be electrically connected to the source/drain region SD. The contact CT may include a first portion being in contact with the contact spacer 242 and a second portion being in contact with the gate spacer 120. The first portion of the contact CT may have a first contact width W1, and the second portion of the contact CT may have a second contact width W2. The first contact width W1 may become progressively greater or be substantially uniform from a bottom end toward a top end of the first portion of the contact CT. The second contact width W2 may become progressively greater or be substantially uniform from a bottom end toward a top end of the second portion of the contact CT. The first contact width W1 greater than the second contact width W2 is illustrated as an example in FIG. 2. However, embodiments of the inventive concepts are not limited thereto. In an exemplary embodiment, the first contact width W1 may be equal to the second contact width W2. The contact CT may include a conductive material. For example, the contact CT may include at least one of a doped semiconductor material, a metal, a metal silicide, or a conductive metal nitride. Thus, the contact CT may correspond to an electrical path electrically connecting the source/drain region SD to an external circuit.

The semiconductor device according to embodiments of the inventive concepts may include the contact spacer 242 disposed on the gate spacer 120. Thus, it is possible to prevent the electrical short between the gate electrode 140 and the contact CT adjacent to the gate electrode 140.

FIGS. 4 to 11 are cross-sectional views corresponding to the lines I-I' and II-II' of FIG. 1 to illustrate a method for manufacturing a semiconductor device according to exemplary embodiments of the inventive concepts.

Figure 4:
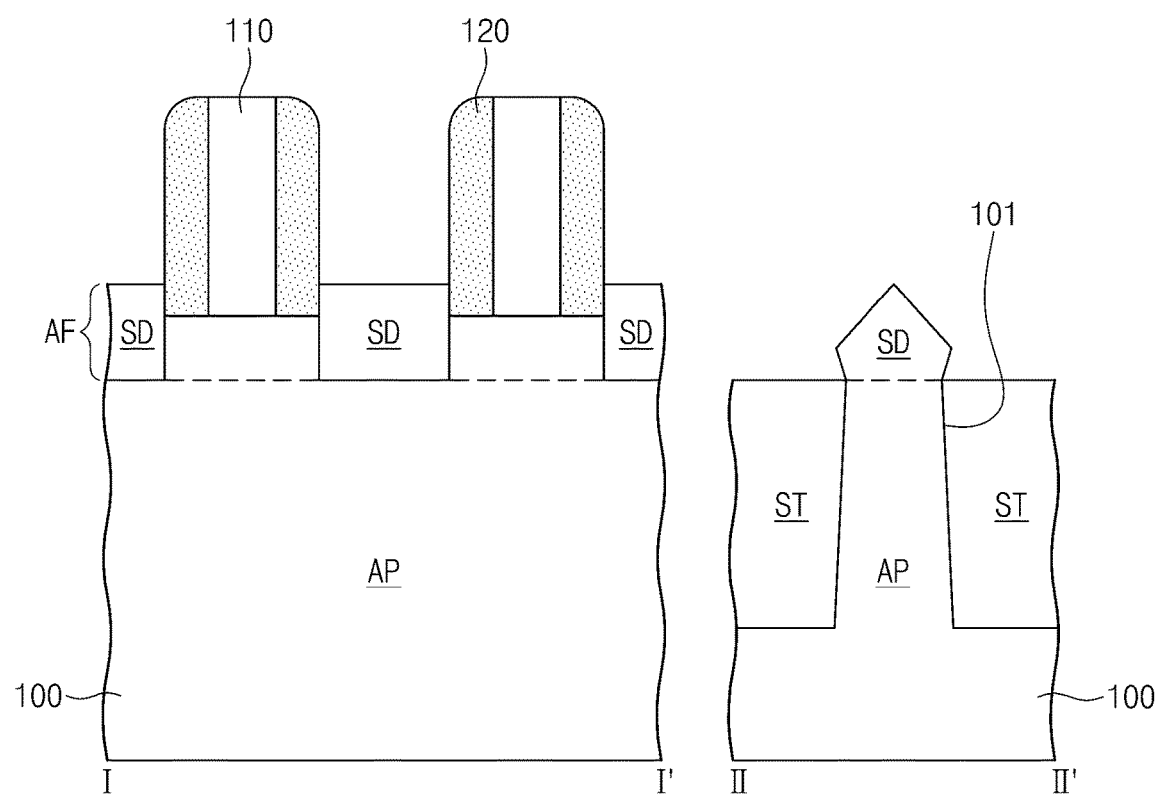
FIGS. 4 to 11 are cross-sectional views corresponding to the lines I-I' and II-II' of FIG. 1 to illustrate a method for manufacturing a semiconductor device according to exemplary embodiments of the inventive concepts.

Referring to FIGS. 1 and 4, device isolation layers ST may be formed in a substrate 100 to define an active pattern AP. In an exemplary embodiment, the device isolation layers ST may be formed by a shallow-trench isolation (STI) process of filling device isolation trenches 101 with an insulating material. The device isolation trenches 101 may be formed by patterning the substrate 100 using a mask pattern (not shown) as an etch mask. The device isolation trenches 101 may extend in a first direction D1. An insulating layer (e.g., a silicon oxide layer) filling the device isolation trenches 101 may be formed on the substrate 100. For example, the insulating layer may be formed on the substrate 100 by a chemical vapor deposition (CVD) process or a physical vapor deposition (PVD) process. The insulating layer may be planarized by an etch-back process or a chemical mechanical polishing (CMP) process until a top surface of the substrate 100 is exposed. Thus, the device isolation layers ST may be formed. In an exemplary embodiment, top surfaces of the device isolation layers ST may be disposed at the same level as the top surface of the substrate 100. The active pattern AP may correspond to a portion of the substrate 100 that may be disposed between the device isolation layers ST extending in the first direction D1. Sidewalls of the active pattern AP may be in contact with sidewalls of the device isolation layers ST.

An active fin AF extending in the first direction D1 may be provided on the active pattern AP. In an exemplary embodiment, the active fin AF may be formed by recessing the device isolation layers ST. For example, the device isolation layers ST may be recessed to expose an upper portion of the active pattern AP. The exposed upper portion of the active pattern AP may correspond to the active fin AF. For example, the device isolation layers ST may be wet-etched to form the active fin AF. An etchant of the wet etching process may be selected such that an etch rate of the device isolation layers ST is higher than an etch rate of the active pattern AP. By the wet etching process, the device isolation layers ST may be recessed by a desired depth. A top surface and sidewalls of the active fin AF may be exposed.

Sacrificial gate patterns 110 may be formed on the active fin AF. In an exemplary embodiment, a sacrificial gate layer may be formed on the substrate 100, and the sacrificial gate layer may be patterned to form the sacrificial gate patterns 110. The sacrificial gate layer may be formed on the substrate 100 by, for example, a CVD process and/or a PVD process. The sacrificial gate layer may be anisotropically etched using a pattern mask as an etch mask to form the sacrificial gate patterns 110. Each of the sacrificial gate patterns 110 may have a line shape or bar shape extending in the second direction D2. The sacrificial gate patterns 110 may intersect the active pattern AP and the device isolation layers ST when viewed from a plan view. The sacrificial gate patterns 110 may be spaced apart from each other in the first direction D1. In an exemplary embodiment, the sacrificial gate patterns 110 may include poly-silicon.

Gate spacers 120 may be formed on both sidewalls of each of the sacrificial gate patterns 110. In an exemplary embodiment, the gate spacers 120 may be formed by anisotropically etching a gate spacer layer. The gate spacer layer may conformally cover the sacrificial gate patterns 110 on the substrate 100. A portion of the gate spacer layer may be removed by a blanket anisotropic etching process, and thus, the gate spacers 120 may be formed. The gate spacer 120 may have a single-layered structure or multi-layered structure including at least one of silicon oxynitride, silicon oxide, silicon-carbon nitride, silicon-boron nitride, silicon-carbon oxynitride, or silicon nitride.

Source/drain regions SD may be formed on the active pattern AP at both sides of each of the sacrificial gate patterns 110. In an embodiment, the active fin AF disposed at both sides of each of the sacrificial gate patterns 110 may be recessed, and a selective epitaxial growth (SEG) process may be performed using the active pattern AP exposed by the recessed regions as a seed to form the source/drain regions SD. The SEG process may include, for example, a CVD process or a molecular beam epitaxy (MBE) process. In an embodiment, top surfaces of the source/drain regions SD may be disposed at a higher level than a top surface of the active fin AF disposed under the sacrificial gate pattern 110. The active fin AF between the source/drain regions SD may correspond to a channel region. In an embodiment, an ion implantation process may be performed using the sacrificial gate patterns 110 as an ion implantation mask to form the source/drain regions SD in the active fin AF.

Figure 5:
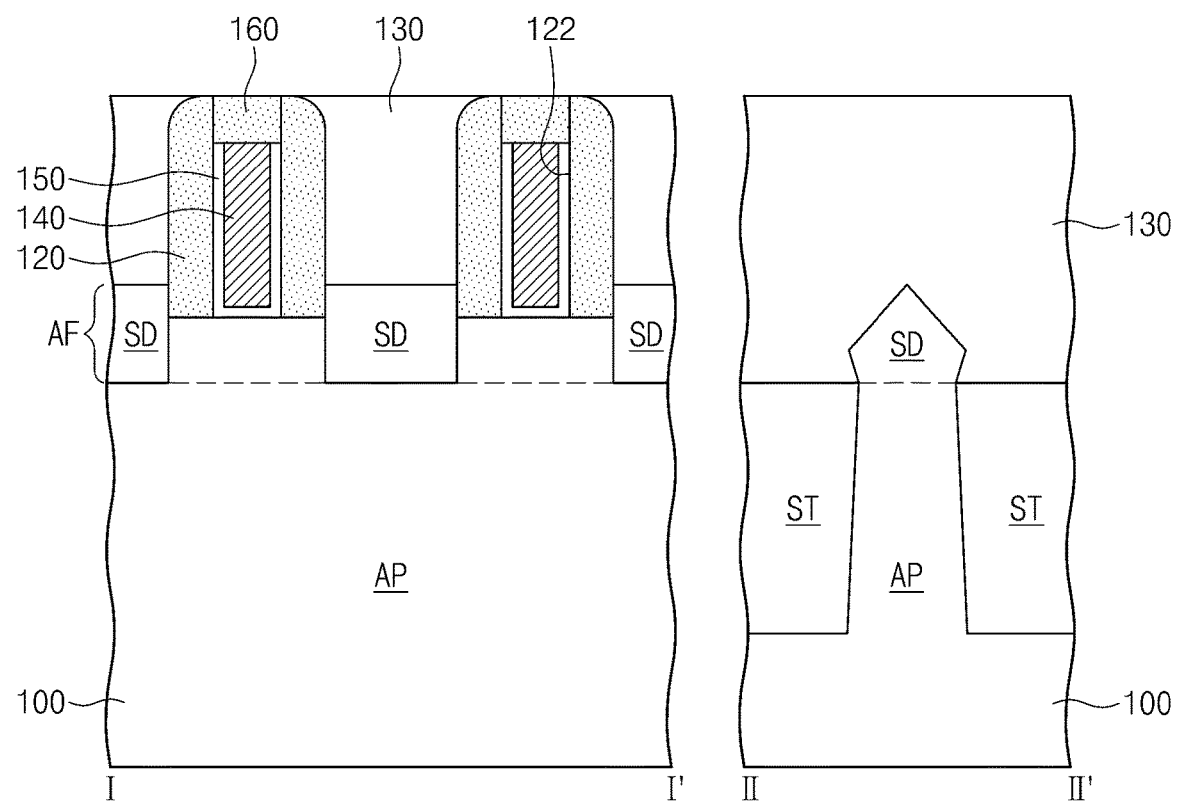

Referring to FIGS. 1 and 5, a gate electrode 140 and a gate dielectric layer 150 may be formed. The gate electrode 140 and the gate dielectric layer 150 may be formed using a process of forming a lower interlayer insulating layer 130 and a process of removing sacrificial gate patterns 110. In an embodiment, the lower interlayer insulating layer 130 may be formed on the substrate 100 to cover the sacrificial gate patterns 110 and the source/drain regions SD. The lower interlayer insulating layer 130 may include, for example, a silicon oxide layer. The lower interlayer insulating layer 130 may be etched or planarized until top surfaces of the sacrificial gate patterns 110 are exposed. For example, the lower interlayer insulating layer 130 may be planarized by an etch-back process or a CMP process.

The sacrificial gate patterns 110 may be removed to form gap regions 122 exposing the top surfaces of the active fins AF. Each of the gap regions 122 may be defined by the gate spacers 120. For example, the gap region 122 may correspond to an empty region formed by the removal of the sacrificial gate pattern 110. In an embodiment, the sacrificial gate patterns 110 may be removed by an etching process having an etch selectivity with respect to the lower interlayer insulating layer 130 and the gate spacers 120. For example, during the etching process, an etch rate of the sacrificial gate patterns 110 may be higher than those of the lower interlayer insulating layer 130 and the gate spacers 120. Thus, the sacrificial gate patterns 110 may be selectively removed.

A gate structure GS and a capping pattern 160 may be formed in each of the gap regions 122. The gate structure GS may include the gate dielectric layer 150 and the gate electrode 140. The gate dielectric layer 150 may be formed in the gap region 122 to conformally cover an inner surface of the gap region 122. The inner surface of the gap region 122 may include the inner sidewalls of the gate spacers 120. The gate dielectric layer 150 may be formed, for example, using an atomic layer deposition (ALD) process or a chemical oxidation process. A conductive layer for forming the gate electrode 140 may be formed on the gate dielectric layer 150 to fill the gap regions 122. The conductive layer may be formed, for example, by an ALD process, a CVD process, and/or a sputtering process. The conductive layer and the gate dielectric layer 150 may be etched or planarized until a top surface of the lower interlayer insulating layer 130 is exposed, thereby forming the gate dielectric layer 150 and the gate electrode 140 in the gap region 122. For example, the conductive layer and the gate dielectric layer 150 may be planarized by an etch-back process and/or a CMP process. After the planarization process, the gate dielectric layer 150 and the gate electrode 140 may be recessed such that top surfaces of the gate dielectric layer 150 and a top surface of the gate electrode 140 are lower than the top surface of the lower interlayer insulating layer 130. Thus, an upper portion of the gap region 122 may be empty. The gate electrode 140 and the gate dielectric layer 150 may be recessed using an etching process having an etch selectivity with respect to the interlayer insulating layer 130. The top surfaces of the gate dielectric layer 150 may be disposed at the same level as the top surface of the gate electrode 140.

The capping pattern 160 may be formed on the gate electrode 140 to fill the empty upper portion of the gap region 122. A top surface of the capping pattern 160 may be disposed at the same level as the top surface of the lower interlayer insulating layer 130. The capping pattern 160 may be formed, for example, using an ALD process, a plasma-enhanced CVD (PE-CVD) process, and/or a high-density plasma CVD (HDP CVD) process. For example, a capping layer may be formed on the lower interlayer insulating layer 130 to fill the empty upper portion of the gap region 122. The capping layer may be planarized by an etch-back process or a CMP process until the top surface of the lower interlayer insulating layer 130 is exposed, thereby forming the capping pattern 160. The capping pattern 160 may be formed of a material having an etch selectivity with respect to the lower interlayer insulating layer 130. For example, the capping pattern 160 may include at least one of silicon oxynitride, silicon oxide, silicon-carbon nitride, silicon-boron nitride, silicon-carbon oxynitride, or silicon nitride. In an embodiment, the capping pattern 160 may include the same material as the gate spacer 120. As a result, the gate structure GS and the capping pattern 160 may be formed in each of the gap regions 122.

Figure 6:
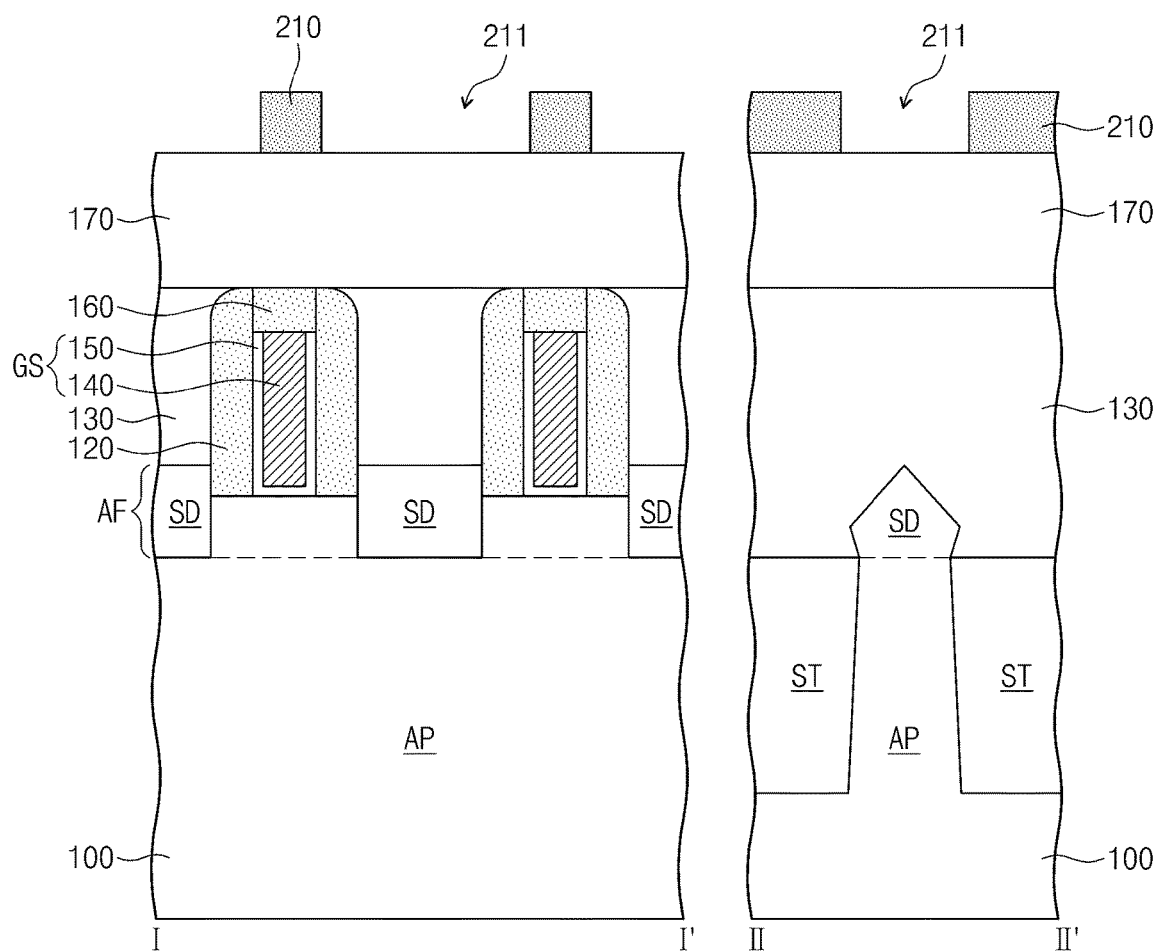

Referring to FIGS. 1 and 6, an upper interlayer insulating layer 170 may be formed on the substrate 100 to cover the gate structures GS and the lower interlayer insulating layer 130. For example, the upper interlayer insulating layer 170 may be formed by a CVD process. A top surface of the upper interlayer insulating layer 170 may be parallel to the top surface of the substrate 100. In one embodiment, the upper interlayer insulating layer 170 may include the same material as the lower interlayer insulating layer 130. For example, the upper interlayer insulating layer 170 may include a silicon oxide layer.

A mask pattern 210 may be formed on the upper interlayer insulating layer 170. The mask pattern 210 may be used in a patterning process of forming a preliminary contact hole to be described later. The mask pattern 210 may have an opening 211 vertically overlapping with the source/drain region SD. The mask pattern 210 may be, for example, a carbon-based spin-on-hardmask (SOH) pattern, a silicon-based SOH pattern, an amorphous carbon pattern, or a photoresist pattern. The mask pattern 210 may be formed by patterning a mask layer. In an embodiment, a SOH layer may be formed on the upper interlayer insulating layer 170 by a spin coating process. The SOH layer may be patterned using an etch mask to form the mask pattern 210. In an embodiment, the patterning process of the SOH layer may include, for example, an anisotropic etching process using a mixture gas and plasma. For example, a mixture gas of a fluorine-based gas and an oxygen ($O_2$) gas or a mixture gas of the fluorine-based gas, the oxygen ($O_2$) gas, and an argon ($Ar_2$) gas may be used in the anisotropic etching process of the SOH layer. The fluorine-based gas may include, for example, $C_3F_6$, $C_4F_6$, $C_4F_8$, or $C_5F_8$. Oxygen plasma may be used in an anisotropic etching process of a carbon-based SOH layer, and halogen plasma may be used in an anisotropic etching process of a silicon-based SOH layer.

Figure 7:
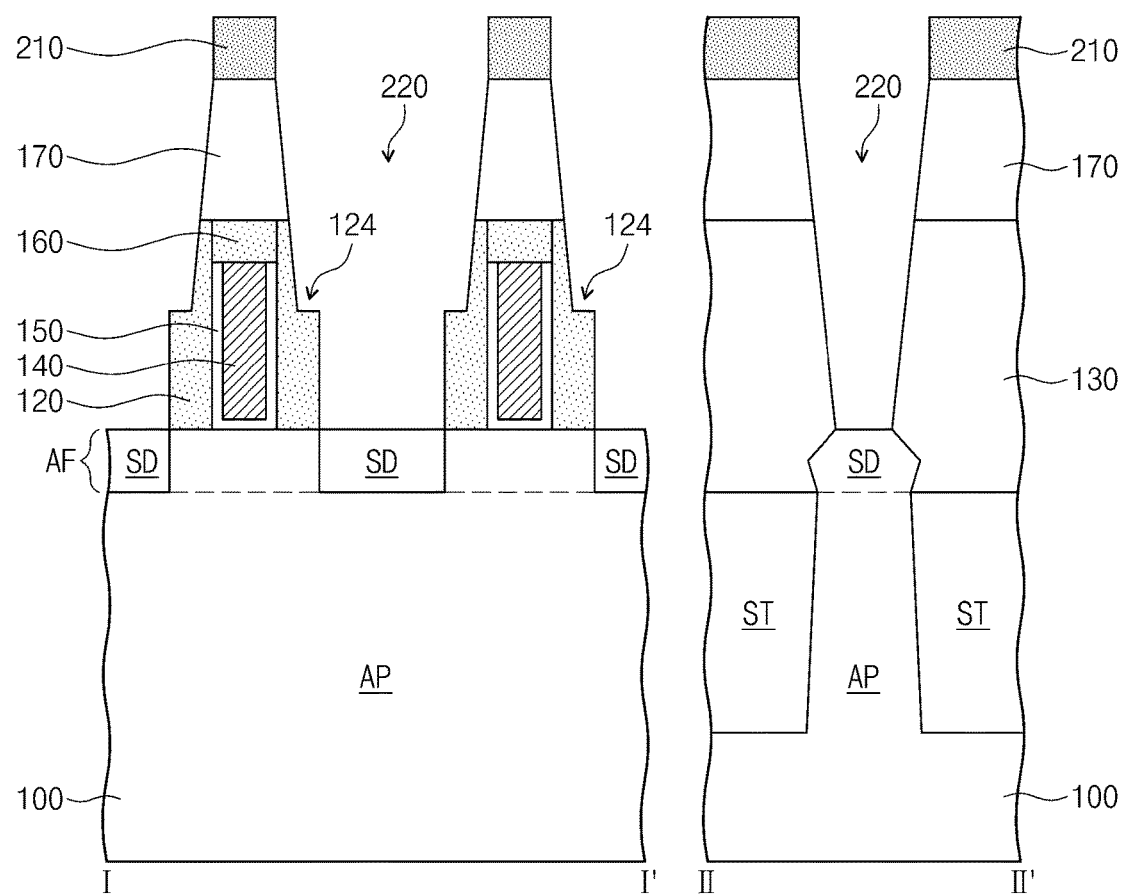

Referring to FIGS. 1, 3, and 7, preliminary contact holes 220 exposing the source/drain regions SD may be formed at both sides of each of the gate structures GS. One of the preliminary contact holes 220 may be formed between the gate structures GS. In an embodiment, the preliminary contact hole 220 may be formed by a self-aligning process using a difference between an etch rate of the interlayer insulating layers 130 and 170 and an etch rate of the gate spacer 120 and the capping pattern 160. For example, the upper interlayer insulating layer 170 may be etched using the mask pattern 210 of FIG. 6 as an etch mask. At this time, the upper interlayer insulating layer 170 under the mask pattern 210 may not be etched but the upper interlayer insulating layer 170 under the opening 211 may be etched. The lower interlayer insulating layer 130 may have an etch selectivity with respect to the gate spacer 120 and the capping pattern 160. Thus, an etch rate of the lower interlayer insulating layer 130 may be different from those of the gate spacer 120 and the capping pattern 160. For example, the etch rate of the lower interlayer insulating layer 130 may be higher than those of the gate spacer 120 and the capping pattern 160. Thus, the lower interlayer insulating layer 130 may be selectively etched. As a result, the preliminary contact hole 220 may be self-aligned with the gate spacers 120.

As illustrated in FIGS. 5-6, in some embodiments, the upper portion of the source/drain region SD in the second direction D2 may, for example, be tapered prior to the etching process described above. In some embodiments, the source/drain region SD may be etched in the manner described above to have, for example, a flat top surface as illustrated in FIGS. 7-11.

When the lower interlayer insulating layer 130 is etched, portions of the gate spacers 120 may be etched. Thus, a recess region 124 may be formed in a sidewall (i.e., the outer sidewall) of the gate spacer 120. An insulating ability of the gate spacer 120 may increase as a thickness of the gate spacer 120 increases. The insulating ability of the gate spacer 120 may be related to insulation between the gate electrode 140 and a contact CT to be described later. The insulating ability of the etched portion of the gate spacer 120 may be less than that of an unetched portion of the gate spacer 120. Thus, if the contact CT is formed in the recess region 124, an electrical short may occur between the gate electrode 140 and the contact CT.

Figure 8:
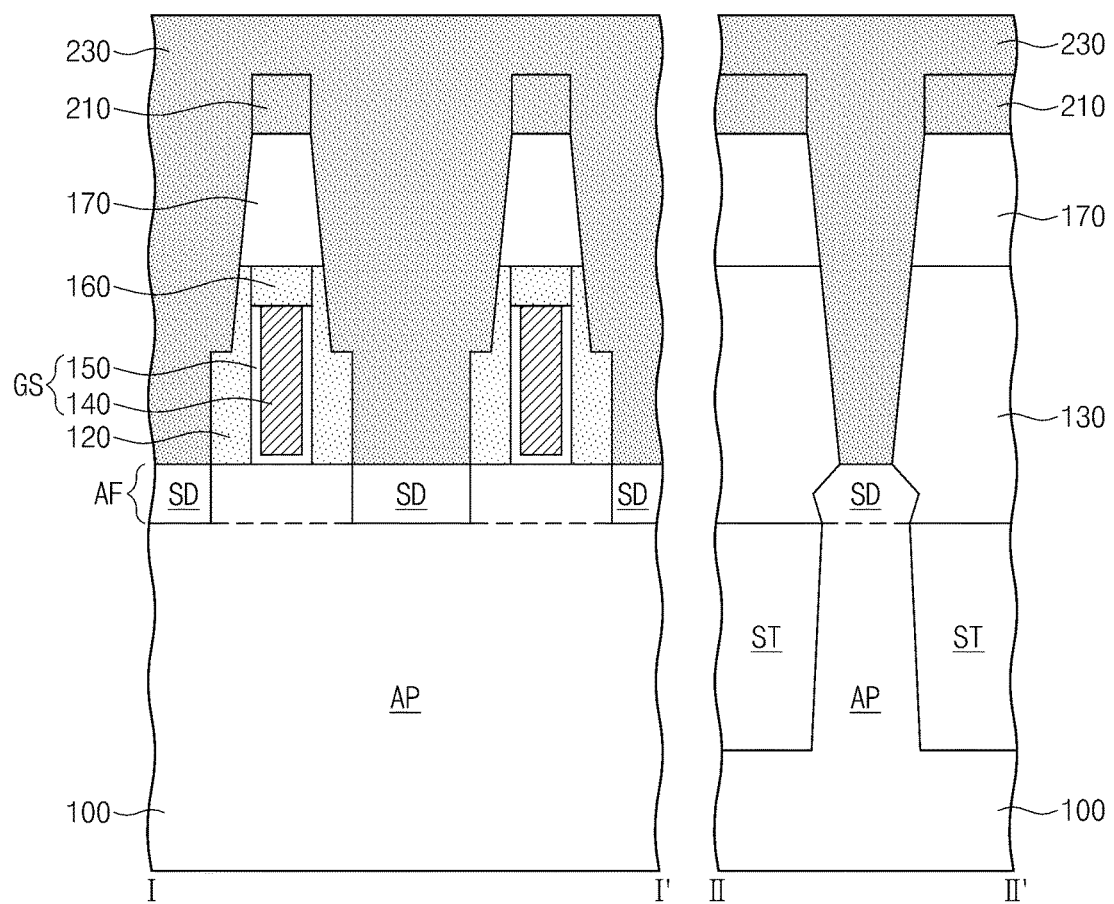

Referring to FIGS. 1 and 8, a sacrificial gap-fill layer 230 may be formed to fill the preliminary contact holes 220. The sacrificial gap-fill layer 230 may include at least one of a carbon-based SOH layer, a silicon-based SOH layer, or an amorphous carbon layer (ACL). In an embodiment, the sacrificial gap-fill layer 230 may include the same material as the mask pattern 210. Thus, the mask pattern 210 may be removed when the sacrificial gap-fill layer 230 is removed. For example, the SOH layer of the sacrificial gap-fill layer 230 may be formed by a spin coating process. The sacrificial gap-fill layer 230 may have a top surface parallel to the top surface of the substrate 100. For example, the amorphous carbon layer of the sacrificial gap-fill layer 230 may be formed by a CVD process. The amorphous carbon layer of the sacrificial gap-fill layer 230 may conformally cover the interlayer insulating layers 130 and 170, the gate spacers 120, and source/drain regions SD.

Figure 9:
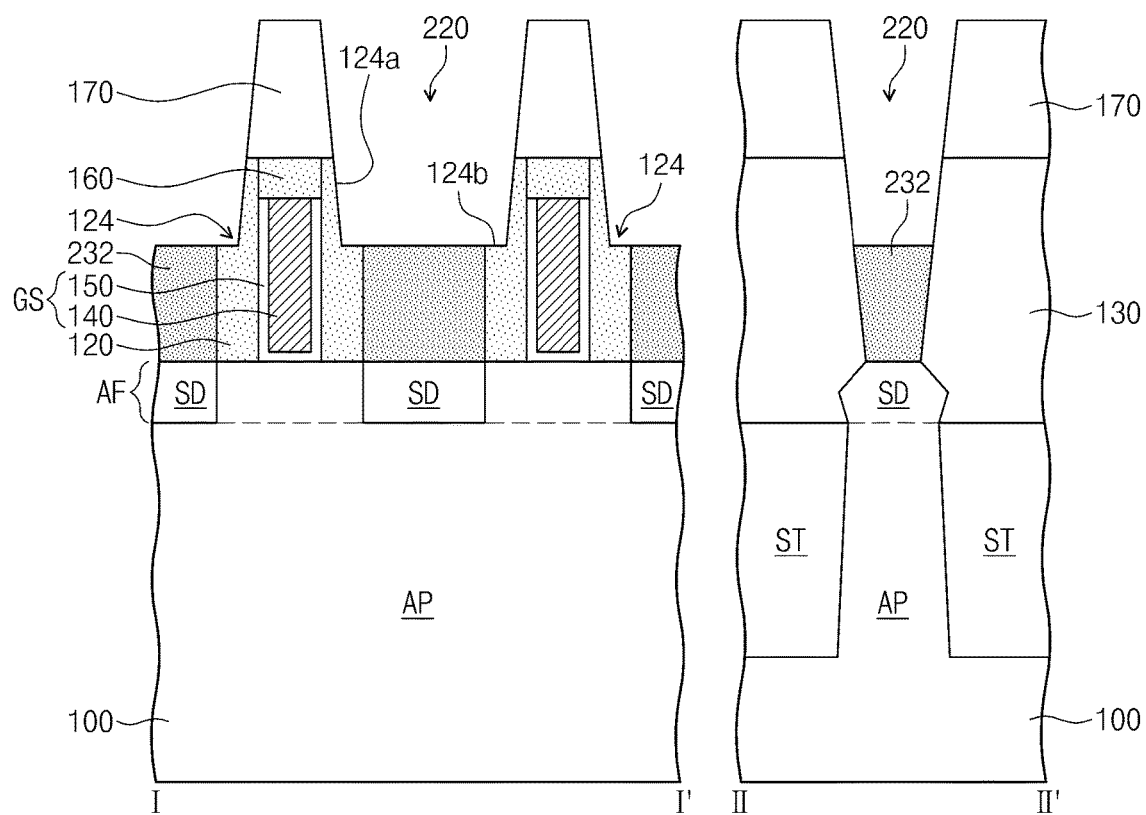

Referring to FIGS. 1 and 9, a portion of the sacrificial gap-fill layer 230 may be removed to form a sacrificial gap-fill pattern 232 in each of the preliminary contact holes 220. A top surface of the sacrificial gap-fill pattern 232 may be disposed at the same level as a bottom surface 124b of the recess region 124 or may be disposed at a lower level than the bottom surface 124b of the recess region 124. Thus, a contact spacer to be described later may completely fill the recess region 124. A surface of the sacrificial gap-fill pattern 232 may be formed by performing an etch-back process and/or a CMP process on the sacrificial gap-fill layer 230. For example, an entire top surface of the sacrificial gap-fill layer 230 including the SOH layer may be anisotropically etched by the etch-back process using a mixture gas and plasma. For example, the etch-back process of the sacrificial gap-fill layer 230 including the SOH layer may use a mixture gas of a fluorine-based gas and an oxygen ($O_2$) gas or a mixture gas of the fluorine-based gas, the oxygen ($O_2$) gas, and an argon ($Ar_2$) gas. The fluorine-based gas may include, for example, $C_3F_6$, $C_4F_6$, $C_4F_8$, or $C_5F_8$. Oxygen plasma may be used in the etch-back process performed on the sacrificial gap-fill layer 230 including the carbon-based SOH layer. Halogen plasma may be used in the etch-back process performed on the sacrificial gap-fill layer 230 including the silicon-based SOH layer. When the etch-back process is performed on the sacrificial gap-fill layer 230, the mask pattern 210 may also be removed.

Figure 10:
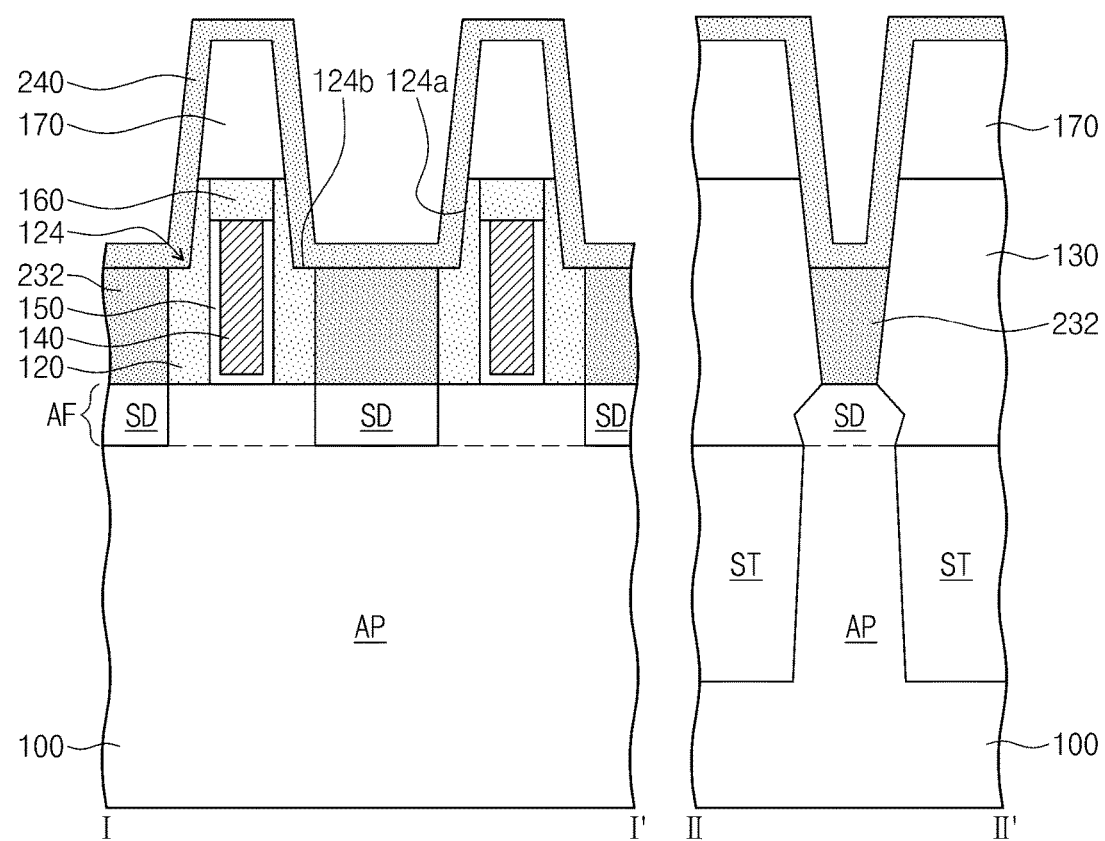

Referring to FIGS. 1 and 10, a contact spacer layer 240 may be formed to cover the sidewall 124a and the top surface 124b of the gate spacer 120 at recess region 124. For example, the contact spacer layer 240 may conformally cover the gate spacers 120. The contact spacer layer 240 may include at least one of silicon oxynitride, silicon oxide, silicon-carbon nitride, silicon-boron nitride, silicon-carbon oxynitride, or silicon nitride. In an embodiment, the contact spacer layer 240 may include the same insulating material as the gate spacer 120. Alternatively, the contact spacer layer 240 may include a different insulating material from the gate spacer 120.

Figure 11:
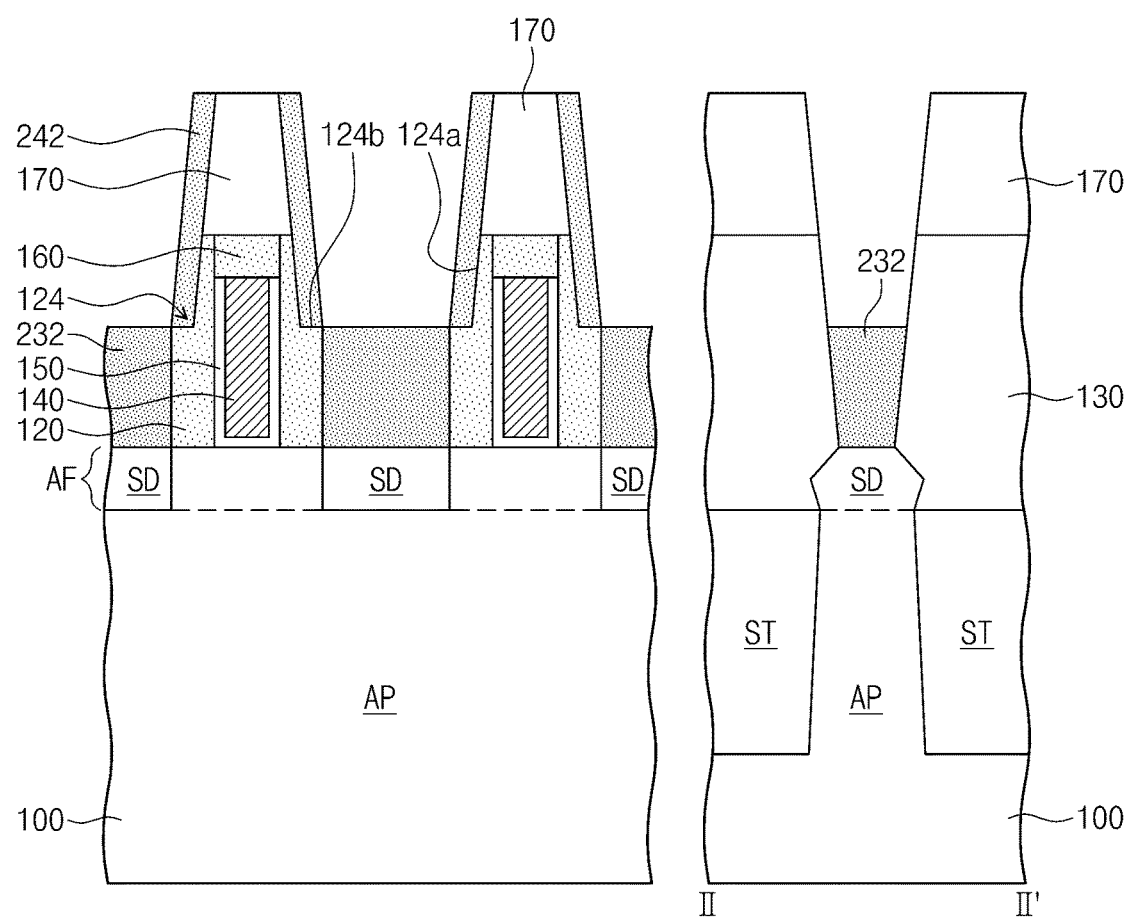

Referring to FIGS. 1 and 11, a portion of the contact spacer layer 240 may be removed to form a contact spacer 242 filling the recess region 124. The contact spacer layer 240 which is in contact with the top surface of the upper interlayer insulating layer 170 and the top surface of the sacrificial gap-fill pattern 232 may be removed by a blanket anisotropic etching process. A bottom surface of the contact spacer 242 may have the same level as the bottom 124b of the recess region 124. In an embodiment, the contact spacer 242 may compensate the loss of the insulating ability caused by the etched gate spacer 120, which is described with reference to FIG. 7. The compensation of the loss of the insulating ability may mean that the spacers 120 and 242 adjacent to the gate electrode 140 have a desired insulating ability. Thus, it is possible to prevent the electrical short between the gate electrode 140 and the contact CT.

In some embodiments, an outer sidewall of the gate spacer 120 at the recess region 124, for example, may contact a first sidewall of the contact spacer 242 at the recess region 124. In some embodiments, a top surface of the gate spacer 120 at the recess region 124, for example, may contact a bottom surface of the contact spacer 242 at the recess region 124. In some embodiments, a bottom surface of the contact spacer 242 at the recess region 124, for example, may extend beyond the capping pattern 160 disposed on the gate electrode 140 and the gate dielectric layer 150 of each of the gate structures GS.

Referring again to FIG. 2, the sacrificial gap-fill patterns 232 may be removed to form contact holes 222. The contact hole 222 may be defined by the contact spacer 242, the gate spacers 120, and the interlayer insulating layers 130 and 170. The contact hole 222 may penetrate the upper interlayer insulating layer 170 and the lower interlayer insulating layer 130 to expose the source/drain region SD. The sacrificial gap-fill patterns 232 may be removed by an etch-back process. For example, the sacrificial gap-fill patterns 232 including the SOH may be removed using an etch-back process using a mixture gas and plasma. For example, the etch-back process of the sacrificial gap-fill patterns 232 including the SOH may use a mixture gas of a fluorine-based gas and an oxygen ($O_2$) gas or a mixture gas of the fluorine-based gas, the oxygen ($O_2$) gas, and an argon ($Ar_2$) gas. The fluorine-based gas may include, for example, $C_3F_6$, $C_4F_6$, $C_4F_8$, or $C_5F_8$. Oxygen plasma may be used in the etch-back process of the sacrificial gap-fill patterns 232 including the carbon-based SOH. Halogen plasma may be used in the etch-back process of the sacrificial gap-fill patterns 232 including the silicon-based SOH.

A contact CT may be formed to fill each of the contact holes 222. The contact CT may include a conductive material. For example, the contact CT may include at least one of a doped semiconductor material, a metal, a metal silicide, or a conductive metal nitride. In an embodiment, the contact CT may be formed using a contact layer. For example, the contact layer filling the contact holes 222 may be formed on the substrate 100 by a CVD process, an ALD process, or a PVD process (e.g., a sputtering process). The contact layer may be planarized until the top surface of the upper interlayer insulating layer 170 is exposed, thereby forming the contacts CT. The planarization process may include an etch-back process and/or a CMP process.

According to embodiments of the disclosure, the contact spacer 242 may be formed on the gate spacer 120. The contact spacer 242 may be substituted for the portion of the gate spacer 120 which is etched during the formation of the preliminary contact hole 220. The contact spacer 242 may compensate the loss of the insulating ability of the gate spacer 120, which may be caused by the etched gate spacer 120. As a result, it is possible to prevent the electrical short between the gate electrode 140 and the contact CT.

According to the embodiments of the disclosed invention, the fin structures described herein may form transistors, and may form, for example, logic circuits in a peripheral region of a memory chip, in microprocessor chip, or in other semiconductor devices.

According to embodiments of the disclosure, the contact spacer may compensate the loss of the insulating ability of the gate spacer which may be caused by the etching of the gate spacer. Thus, it is possible to prevent the electrical short between the gate electrode and the contact.

While the disclosed invention have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A method for manufacturing a semiconductor device, the method comprising:
    forming a plurality of gate structures, a plurality of gate spacers, and an interlayer insulating layer on a substrate, the plurality of gate structures spaced apart from each other in a first direction, the plurality of gate spacers spaced apart from each other in said first direction and covering sidewalls of each of the plurality of gate structures, and the interlayer insulating layer covering each of the plurality of gate spacers;
    forming a contact hole that penetrates the interlayer insulating layer to expose a sidewall of at least one of the plurality of gate spacers;
    forming a sacrificial gap-fill pattern filling a lower portion of the contact hole;
    forming a contact spacer on a sidewall of the contact hole having the sacrificial gap-fill pattern; and
    forming a contact filling the contact hole after removing the sacrificial gap-fill pattern.

2. The method of claim 1, wherein the forming of the contact hole comprises:
    forming a mask pattern on the interlayer insulating layer; and
    patterning the interlayer insulating layer using the mask pattern.

3. The method of claim 2, wherein the mask pattern is a carbon-based spin-on-hardmask (SOH) pattern, a silicon-based SOH pattern, an amorphous carbon pattern, or a photoresist pattern.

4. The method of claim 2, wherein the mask pattern includes the same material as the sacrificial gap-fill pattern.

5. The method of claim 1, wherein at least a portion of the gate spacer is removed to form a recess region when the contact hole is formed, and
    wherein the contact spacer is substituted for the removed portion of the gate spacer.

6. The method of claim 5, wherein a bottom surface of the contact spacer is disposed at the same level as a bottom of the recess region.

7. The method of claim 1, wherein a bottom surface of the contact spacer is disposed at the same level as a top surface of the sacrificial gap-fill pattern.

8. The method of claim 1, wherein the sacrificial gap-fill pattern is a carbon-based spin-on-hardmask (SOH) pattern, a silicon-based SOH pattern, or an amorphous carbon pattern.

9. The method of claim 1, wherein the forming of the sacrificial gap-fill pattern comprises:
    forming a sacrificial gap-fill layer filling the contact hole on the substrate; and performing an etch-back process on the sacrificial gap-fill layer.

10. The method of claim 1, wherein the contact spacer includes the same insulating material as the gate spacer.

11. The method of claim 1, wherein the contact spacer and the gate spacer include insulating materials different from each other.

12. The method of claim 1, wherein the contact spacer includes at least one of silicon oxynitride, silicon oxide, silicon-carbon nitride, silicon-boron nitride, silicon-carbon oxynitride, or silicon nitride.

13. The method of claim 1, wherein the contact comprises: a first portion being in contact with the contact spacer; and a second portion being in contact with the gate spacer, and
   wherein a width of the first portion of the contact is equal to or greater than a width of the second portion of the contact.

14. The method of claim 1 further comprising:
   forming a source/drain region between two gate structures of the plurality of gate structures on the substrate, the interlayer insulating layer covering the plurality of gate spacers and the source/drain region; and
   forming a contact hole that penetrates the interlayer insulating layer to expose a top surface of the source/drain region and sidewalls of the plurality of gate spacers.

15. A method, comprising:
   providing a substrate;
   providing a gate structure on the substrate;
   providing a gate spacer disposed on a sidewall of the gate structure and having a recess region formed in an upper sidewall of the gate spacer;
   providing a contact spacer filling the recess region and contacting a sidewall of the gate spacer of the recess region; and
   providing an electrical contact being in contact with the sidewall of the gate spacer and a sidewall of the contact spacer.

16. The method of claim 15, wherein a distance from the gate structure to the sidewall of the gate spacer being in contact with the contact spacer is smaller than a distance from the gate structure to a sidewall of the gate spacer being in contact with the contact.

17. The method of claim 15, wherein providing the electrical contact includes:
   forming a contact hole that penetrates an interlayer insulating layer disposed on the substrate to expose the sidewall of the gate spacer;
   forming a sacrificial gap-fill pattern at a lower portion of the contact hole;
   forming the contact spacer on a sidewall of the contact hole having the sacrificial gap-fill pattern; and
   forming the electrical contact after removing the sacrificial gap-fill pattern.

18. The method of claim 15, wherein an outer sidewall of the gate spacer at the recess region contacts a first sidewall of the contact spacer at the recess region.

19. The method of claim 15, wherein a top surface of the of the gate spacer at the recess region contacts a bottom surface of the contact spacer at the recess region.

20. The method of claim 15, wherein the electrical contact comprises: a first portion being in contact with the contact spacer; and a second portion being in contact with the gate spacer, and
   wherein a width of the first portion of the electrical contact is equal to or greater than a width of the second portion of the electrical contact.

* * * * *